United States Patent
Sohn et al.

(10) Patent No.: US 7,292,483 B2
(45) Date of Patent: Nov. 6, 2007

(54) BACK-BIAS VOLTAGE GENERATOR FOR DECREASING A CURRENT CONSUMPTION OF A SELF-REFRESH OPERATION

(75) Inventors: Young-Chul Sohn, Kyoungki-do (KR); Bong-Hwa Jeong, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 43 days.

(21) Appl. No.: 11/322,947

(22) Filed: Dec. 30, 2005

(65) Prior Publication Data

US 2007/0058474 A1 Mar. 15, 2007

(30) Foreign Application Priority Data

Sep. 14, 2005 (KR) .................. 10-2005-0085719

(51) Int. Cl.
  *G11C 5/14* (2006.01)
  *G05F 1/575* (2006.01)
(52) U.S. Cl. .................. 365/189.09; 365/189.07; 365/189.08; 365/222; 365/204; 365/194; 365/233.5; 365/227; 327/537; 327/535
(58) Field of Classification Search ........... 365/189.09, 365/189.08, 189.07, 222, 204, 233, 194, 365/233.5, 227, 229; 327/536, 537, 535, 327/534
See application file for complete search history.

(56) References Cited

U.S. PATENT DOCUMENTS

| 4,920,280 | A | * | 4/1990 | Cho et al. ................ 327/536 |
| 5,715,199 | A | * | 2/1998 | Kim ....................... 365/189.09 |
| 5,886,932 | A | | 3/1999 | Choi ...................... 365/189.09 |
| 5,889,709 | A | * | 3/1999 | Fukuda .................. 365/189.05 |
| 5,995,434 | A | | 11/1999 | Ryu ........................... 365/222 |
| 6,194,931 | B1 | * | 2/2001 | Hwang ....................... 327/157 |
| 6,249,473 | B1 | | 6/2001 | Lau et al. .................... 365/227 |
| 6,333,873 | B1 | | 12/2001 | Kumanoya et al. ..... 365/189.09 |
| 6,411,157 | B1 | | 6/2002 | Hsu et al. .................... 327/536 |
| 6,438,041 | B1 | * | 8/2002 | Yamada et al. ......... 365/189.09 |
| 7,046,074 | B2 | * | 5/2006 | Jang ........................... 327/534 |
| 2005/0141310 | A1 | | 6/2005 | Lee et al. .................... 365/222 |
| 2006/0104138 | A1 | * | 5/2006 | Kim ........................... 365/222 |

FOREIGN PATENT DOCUMENTS

| JP | 10199244 | 7/1998 |
| JP | 2000149557 | 5/2000 |
| KR | 0142953 | 4/1998 |
| KR | 1999-0074796 | 10/1999 |
| KR | 2002-0043780 | 6/2002 |
| KR | 10-2005-0086255 | 8/2005 |

* cited by examiner

Primary Examiner—Andrew Q. Tran
(74) Attorney, Agent, or Firm—Blakely Sokoloff Taylor & Zafman

(57) ABSTRACT

An internal voltage generator for generating a back bias voltage includes a back bias voltage pumping block for comparing a reference voltage with a feedback back bias voltage to generate a back bias enable signal and the back bias voltage in response to an activated self refresh signal and a back bias voltage discharge controlling unit for discharging the back bias voltage into a ground voltage in response to the activated self refresh signal and the back bias enable signal.

17 Claims, 5 Drawing Sheets

BACK-BIAS VOLTAGE GENERATOR FOR DECREASING A CURRENT CONSUMPTION OF A SELF-REFRESH OPERATION

FIELD OF THE INVENTION

The present invention relates to an internal voltage generator; and, more particularly, to an internal voltage generator for decreasing a current consumption of a self-refresh operation.

DESCRIPTION OF RELATED ARTS

Generally, a semiconductor memory device includes a plurality of memory cells, a plurality of sense amplifiers for driving the memory cells, a row decoder, and a column decoder. A data stored in a predetermined memory cell is selected by using the row decoder and the column decoder and, then, amplified by the sense amplifier.

The memory cell of a dynamic random access memory (DRAM) is provided with one cell transistor performing a switching operation and one capacitor storing the data. Meanwhile, the data stored in the capacitor is discharged because of a leakage current occurred at a PN junction of the cell transistor. Therefore, a refresh operation is performed to maintain the original data level by recharging the capacitor.

The refresh operation is similar to a read/write operation of the DRAM. That is, the refresh operation is performed by amplifying the data stored in the memory cell and, then, restoring the data into the memory cell.

Meanwhile, a self-refresh operation, a kind of the refresh operation, is independently performed inside of a semiconductor memory device. That is, the self-refresh operation is performed at every predetermined time without an external command. Therefore, an internal command for the self-refresh operation is generated inside of the semiconductor memory device when a predetermined condition is satisfied.

As an operation voltage of the DRAM is lowered, it is also required to minimize a current consumption caused during the self-refresh operation. In order to decrease the current consumption, usually, a refresh period is increased. In other words, the memory cell maintains the data for a longer period.

Conventionally, an absolute value of a back bias voltage VBB level of the cell transistor is increased in order to increase the refresh period by reducing a leakage current of the cell transistor.

FIG. 1 is a block diagram describing a conventional internal voltage generator for increasing a back bias voltage VBB.

The conventional internal voltage generator includes a VBB reference generator 10, VBB detector 20, and VBB pump 30.

The VBB reference generator 10 outputs a reference voltage in response to a self-refresh signal SREF. The reference voltage determines a level of the back bias voltage VBB. The VBB detector 20 detects the level of the back bias voltage VBB based on the reference voltage to thereby back bias enable signal VBB_EN. Further, the VBB pump 30 performs a pumping operation to thereby generate the back bias voltage VBB in response to the back bias enable signal VBB_EN.

When the level of the back bias voltage VBB is higher than a target level, the conventional internal voltage generator enables the VBB pump 30 in order to decrease the level of the back bias voltage VBB. On the contrary, when the level of the back bias voltage VBB reaches at the target level, the conventional internal voltage generator stops the pumping operation to maintain the level of the back bias voltage VBB.

That is, the conventional internal voltage generator increases the back bias voltage VBB level at an activation of the self-refresh signal SREF. Therefore, the reference voltage outputted from the VBB reference generator 10 is increased to increase the back bias voltage VBB level.

Meanwhile, it takes a predetermined delay time for the conventional internal voltage generator to increase the back bias voltage VBB level into a target level. Thus, when the back bias voltage VBB level cannot reach to the target level in time, a data retention time of a memory cell refreshed at an initial self-refresh operation becomes different with that of a memory cell refreshed after the back bias voltage VBB level reaches to the target level. In this case, the refresh operation can be failed.

SUMMARY OF THE INVENTION

It is, therefore, an object of the present invention to provide an internal voltage generator for reducing a time for increasing a back bias voltage level at the initial self-refreshing operation by discharging the back bias voltage level into a ground voltage VSS level.

In accordance with an aspect of the present invention, there is provided an internal voltage generator including a back bias voltage pumping block for comparing a reference voltage with a feedback back bias voltage to generate a back bias enable signal and the back bias voltage in response to an activated self refresh signal; and a back bias voltage discharge controlling unit for discharging the back bias voltage into a ground voltage in response to the activated self refresh signal and the back bias enable signal.

In accordance with another aspect of the present invention, there is provided a semiconductor memory device including a back bias voltage pumping block for comparing a reference voltage with a feedback back bias voltage to generate a back bias enable signal and the back bias voltage in response to an activated self refresh signal; and a back bias voltage discharge controlling unit for discharging the back bias voltage into a ground voltage in response to the activated self refresh signal and the back bias enable signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an internal voltage generator in accordance with the present invention will be described in detail referring to the accompanying drawings.

Figure 1:
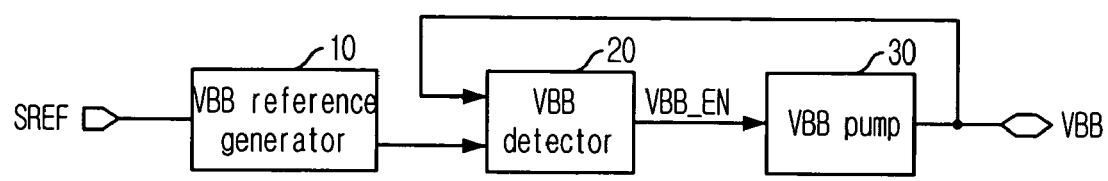
FIG. 1 is a block diagram describing a conventional internal voltage generator for increasing a back bias voltage VBB.
Figure 2:
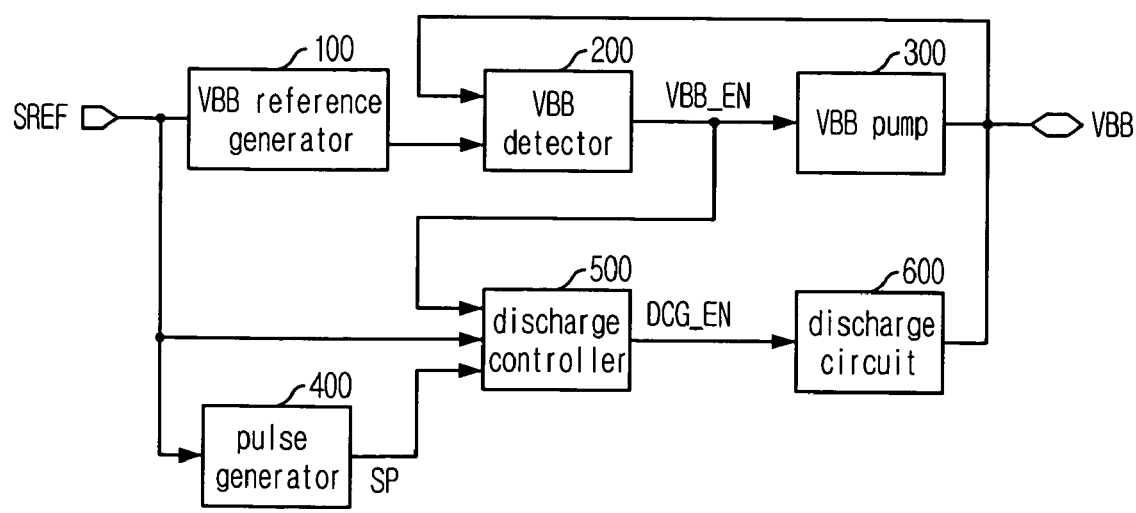
FIG. 2 is a block diagram showing an internal voltage generator in accordance with a preferred embodiment of the present invention.

FIG. 2 is a block diagram showing an internal voltage generator in accordance with a preferred embodiment of the present invention.

As shown, the internal voltage generator of the present invention includes a VBB reference generator 100, a VBB detector 200, a VBB pump 300, a pulse generator 400, a VBB discharge controller 500, and a VBB discharge circuit 600.

The VBB reference generator 100 outputs a reference voltage in response to a self-refresh signal SREF. The reference voltage determines a level of a back bias voltage VBB. The VBB detector 200 detects the level of the back bias voltage VBB based on the reference voltage to thereby output back bias enable signal VBB_EN. Further, the VBB pump 300 performs a pumping operation to thereby generate the back bias voltage VBB in response to the back bias enable signal VBB_EN.

Further, the pulse generator 400 generates a sink pulse SP based on the self-refresh signal SREF. The VBB discharge controller 500 outputs a discharge enable signal DCG_EN in response to the back bias enable signal VBB_EN, the self-refresh signal SREF, and the sink pulse signal SP. The VBB discharge circuit 600 increases the level of the back bias voltage VBB in response to the discharge enable signal DCG_EN.

Figure 3:
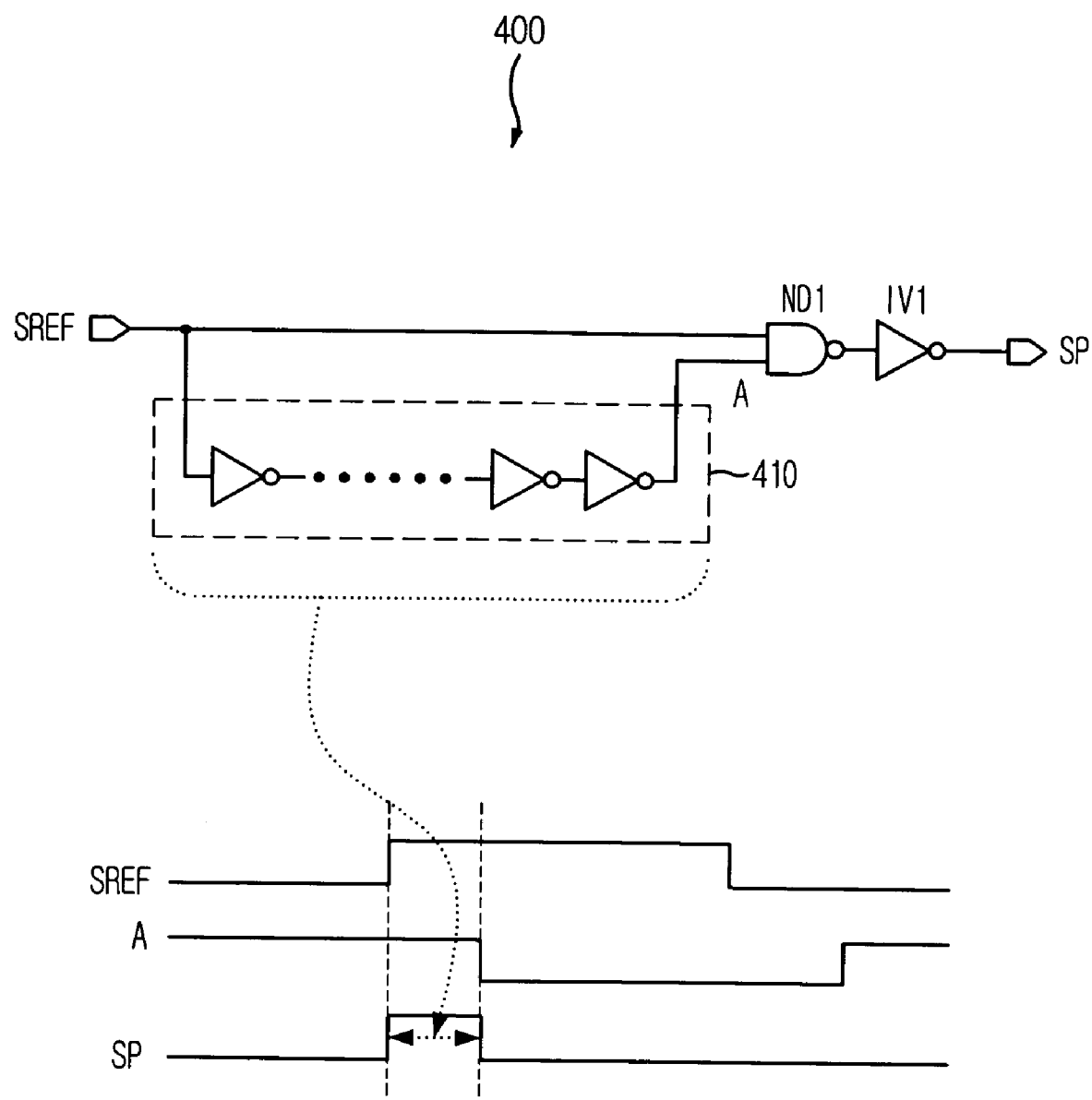
FIG. 3 is a schematic circuit diagram depicting a pulse generator shown in FIG. 2.

FIG. 3 is a schematic circuit diagram depicting the pulse generator 400 shown in FIG. 2.

As shown, the pulse generator 400 is provided with an inverter chain 410, a NAND gate ND1, and an inverter IV1.

The inverter chain 410 includes a plurality of inverters for delaying the self-refresh signal SREF by a predetermined time to output a signal A. Usually, the number of inverters included in the inverter chain is odd number. The NAND gate ND1 receives the self-refresh signal SREF and a delayed self-refresh signal SREF, i.e., the signal A. The inverter IV1 inverts an output of the NAND gate ND1 to thereby output the sink pulse SP.

The pulse generator 400 controls a delay length of the sink pulse SP according to the numbers of inverters included in the inverter chain 410.

Figure 4:
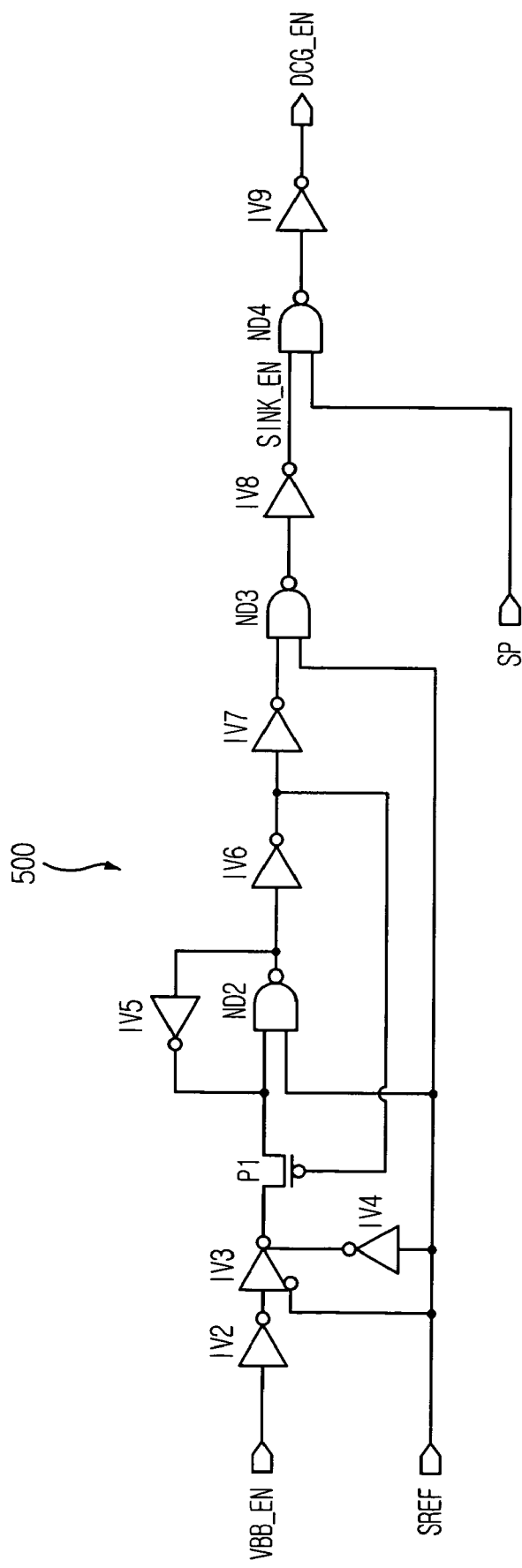
FIG. 4 is a schematic circuit diagram showing a discharge controller shown in FIG. 2.

FIG. 4 is a schematic circuit diagram showing the discharge controller 500 shown in FIG. 2.

As shown, the discharge controller 500 includes a plurality of inverters IV2 to IV9, a PMOS transistor P1, and two NAND gates ND2 and ND3.

Herein, the fourth inverter IV4 inverts the self-refresh signal SREF. The second and third inverters IV2 and IV3 delays the back bias enable signal VBB_EN in response to the self-refresh signal SREF. That is, the third inverter IV3 implemented with a tri-state inverter selects a path of the back bias enable signal VBB_EN in response to the self-refresh signal SREF.

The PMOS transistor P1, receiving an output of the sixth inverter IV6 through its gate, is selectively switched to alternatively output an output of the third inverter IV3 to the second NAND gate ND2. The second NAND gate ND2 receives an output of the PMOS transistor P1 and the self-refresh signal SREF. The fifth inverter IV5 inverts an output of the second NAND gate ND2 and transmits an inverted output of the second NAND gate ND2 to the second NAND gate ND2 as a feedback input.

Further, the third NAND gate ND3 receives an output of the seventh inverter IV7 and the self-refresh signal SREF. The eighth inverter IV8 inverts an output of the third NAND gate ND3 to output the inverted signal as a sink enable signal SINK_EN. The fourth NAND gate ND4 receives the sink enable signal SINK_EN and the sink pulse SP. The ninth inverter IV9 inverts an output of the fourth NAND gate ND4 to thereby output the inverted signal as the discharge enable signal DCG_EN.

Figure 5:
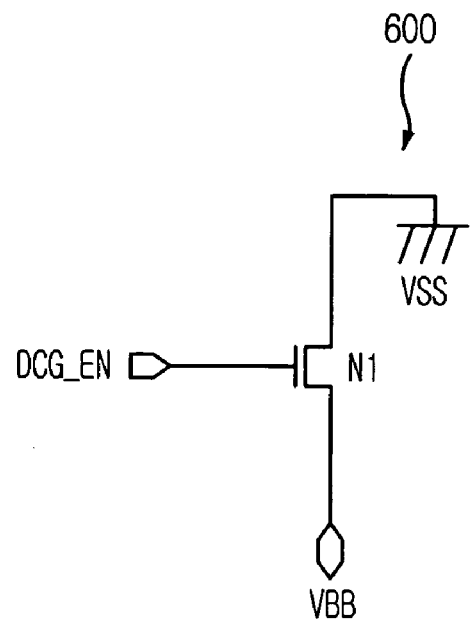
FIG. 5 is a schematic circuit diagram describing a VBB discharge circuit shown in FIG. 2.

FIG. 5 is a schematic circuit diagram describing the VBB discharge circuit 600 shown in FIG. 2.

As shown, the VBB discharge circuit 600 is provided with a NMOS transistor N1 connected between a ground voltage VSS and the back bias voltage VBB. The NMOS transistor N1 receives the discharge enable signal DCG_EN through a gate thereof.

Figure 6:
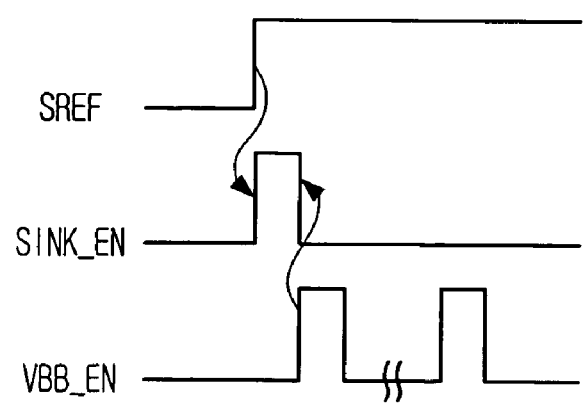
FIGS. 6 and 7 are waveforms demonstrating an operation of the internal voltage generator shown in FIG. 2.
Figure 7:
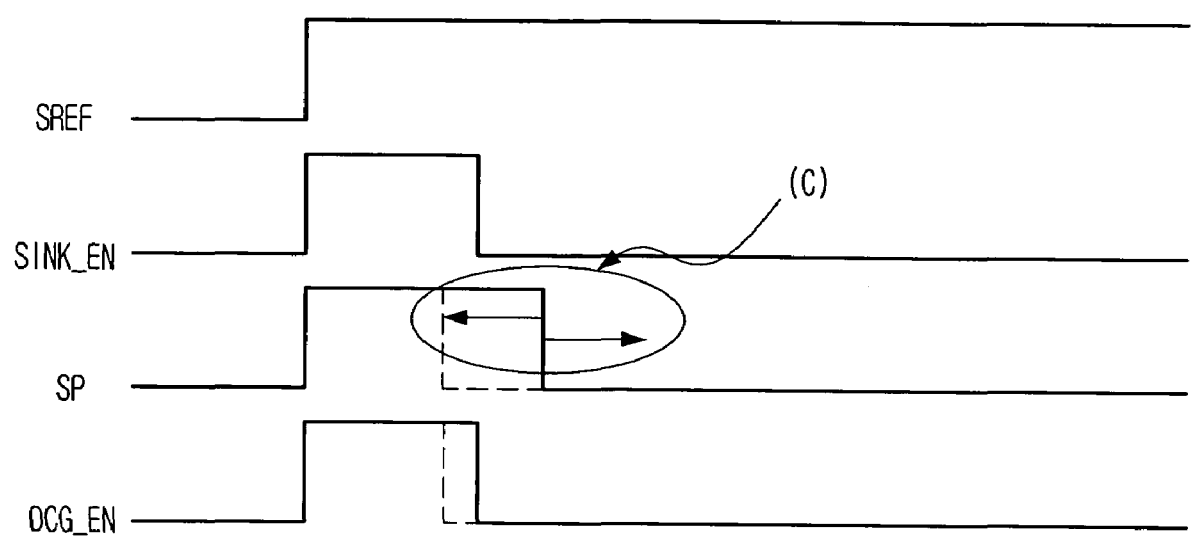

FIGS. 6 and 7 are waveforms demonstrating an operation of the internal voltage generator shown in FIG. 2.

First, the internal voltage generator increases the reference voltage outputted from the VBB reference generator 100 into a target level. Then, the VBB detector 200 detects the back bias voltage VBB level based on the reference voltage. The VBB pump 300 decreases the back bias voltage VBB level when the back bias voltage VBB level is higher than a target level. On the contrary, when the back bias voltage VBB level detected by the VBB detector reaches to the target level, the VBB pump 300 stops the pumping operation.

Meanwhile, when the self-refresh signal SREF is a logic level 'L', a latch provided with the fifth inverter IV5 and the second NAND gate ND2 is reset to thereby make the output of the sixth inverter be a logic level 'L'. Thus, the PMOS transistor P1 is turned on to transmit the output of the third inverter IV3 to the latch. The output of the third NAND gate ND3 becomes a logic level 'H' in response to the self-refresh signal SREF having a logic level 'L' and the logic level 'H' output of the seventh inverter IV7. The eighth inverter IV8 inverts the output of the third NAND gate ND3 to thereby output the sink enable signal SINK_EN having a logic level 'L'.

Then, when the self-refresh signal SREF becomes a logic level 'H', the output of the third NAND gate ND3 becomes a logic level 'L'. Thus, the eighth inverter IV8 inverts the output of the third NAND gate ND3 to output the sink enable signal SINK_EN having a logic level 'H'.

Referring to FIG. 7, the sink pulse SP becomes a logic level 'H' in response to the self-refresh signal SREF of the logic level 'H'. As denoted in (c), a pulse length of the sink pulse SP is variable.

Herein, the sink enable signal SINK_EN, generated by combining the back bias enable signal VBB_EN and the self-refresh signal SREF, is activated as a logic level 'H' only once when the self-refresh signal SREF becomes the logic level 'H'.

Therefore, the discharge enable signal DCG_EN is activated as a logic level 'H' in response to the sink enable signal SINK_EN and the self-refresh signal SREF and, thus, the NMOS transistor N1 is turned on. Consequently, the back bias voltage VBB level is increased into a level of the ground voltage VSS.

Thereafter, when the back bias enable signal VBB_EN becomes a logic level 'H', the sink enable signal SINK_EN is disabled as a logic level 'L'. Then, the discharge enable signal DCG_EN is inactivated as a logic level 'L' in response to the sink enable signal SINK_EN. The NMOS transistor N1 is turned off in response to the discharge signal DCG_EN and, therefore, the ground voltage VSS is not supplied as the back bias voltage VBB.

Herein, during the activation of the self-refresh signal SREF, if an activation timing of the back bias enable signal VBB_EN is lagged, a timing when the sink enable signal SINK_EN becomes a logic level 'L' is also lagged. Therefore, the discharge enable signal DCG_EN becomes the logic level 'L' lately. In this case, the back bias voltage VBB is over discharged; therefore, latch-up can be occurred at the NMOS transistor N1 or the back bias pumping operation is excessively performed.

In order to prevent the problems, the pulse generator 400 adjusts the pulse length of the sink pulse SP according to the numbers of inverters included in the inverter chain 410. Therefore, after a delay time based on the pulse length of the sink pulse SP is passed, the sink enable signal SINK_EN is forcibly disabled.

That is, the present invention discharges the back bias voltage VBB before the back bias voltage VBB level reaches to the target level in order to reduce a time for increasing the back bias voltage VBB level. Meanwhile, after the back bias voltage VBB reaches to the target level, the present invention stops discharging the back bias voltage VBB to prevent the back bias voltage VBB level from excessively being increased.

As abovementioned, the present invention reduces the time for increasing the back bias voltage VBB level at the initial self-refreshing operation by discharging the back bias voltage VBB level as the ground voltage VSS level.

The present application contains subject matter related to Korean patent application No. 2005-85719, filed in the Korean Patent Office on Sep. 14, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for generating a back bias voltage, comprising:
   a back bias voltage pumping block for comparing a reference voltage with a feedback back bias voltage to generate a back bias enable signal and the back bias voltage in response to an activated self refresh signal; and
   a back bias voltage discharge controlling unit for discharging the back bias voltage into a ground voltage in response to the activated self refresh signal and the back bias enable signal.

2. The internal voltage generator as recited in claim 1, wherein the back bias voltage discharge controlling unit includes:
   a pulse generator for generating a sink pulse by delaying the self refresh signal for a predetermined time;
   a back bias voltage discharge controller for activating a discharge enable signal discharging the back bias voltage into the ground voltage when the self refresh signal is activated and for inactivating the discharge enable signal when the back bias enable signal is activated; and
   a back bias voltage discharge circuit for transmitting the ground voltage to the back bias voltage in response to an activation of the discharge enable signal.

3. The internal voltage generator as recited in claim 2, wherein the pulse generator includes:
   an inverter chain for delaying the self refresh signal for the predetermined time; and
   a first logic block for receiving the self refresh signal and an output of the inverter chain to thereby generate the sink pulse.

4. The internal voltage generator as recited in claim 3, wherein the inverter chain is provided with an odd number of inverters for inverting the self refresh signal.

5. The internal voltage generator as recited in claim 2, wherein the back bias voltage discharge controller activates the discharge enable signal when the self refresh signal and a sink enable signal are activated.

6. The internal voltage generator as recited in claim 5, wherein the back bias voltage discharge controller deactivates the discharge enable signal when the sink enable signal is disabled at an activation of the back bias enable signal.

7. The internal voltage generator as recited in claim 6, wherein the back bias voltage discharge controller forcibly disables the discharge enable signal when the sink pulse is deactivated.

8. The internal voltage generator as recited in claim 7, wherein the back bias voltage discharge controller includes:
   a second logic block for receiving the self refresh signal and the back bias enable signal to thereby output the sink enable signal; and
   a third logic block for receiving the sink enable signal and the sink pulse to thereby output the discharge enable signal.

9. The internal voltage generator as recited in claim 8, wherein the second logic block disables the sink enable signal when the self refresh signal is inactivated and activates the sink enable signal when the self refresh signal is activated until the back bias enable signal is activated.

10. The internal voltage generator as recited in claim 8, wherein the second logic block activates the sink enable signal only once at the activation of the self refresh signal.

11. The internal voltage generator as recited in claim 8, wherein the second logic block includes:
   a first inverter for inverting the self refresh signal;
   a second and a third inverter for delaying the back bias enable signal in response to an output of the first inverter;
   a first driver for selectively output an output of the third inverter in response to a feedback input;
   a latch for latching an output of the first driver for a predefined time in response to the self refresh signal;
   a fourth inverter for inverting an output of the latch to thereby output the feedback input;
   a fifth inverter for inverting an output of the fourth inverter;
   a first NAND gate for receiving an output of the fifth inverter and the self refresh signal; and
   a sixth inverter for inverting an output of the first NAND gate to thereby output the sink enable signal.

12. The internal voltage generator as recited in claim 8, wherein the third logic block includes:
   a first NAND gate for receiving the sink enable signal and the sink pulse; and
   an inverter for inverting an output of the first NAND gate to thereby output the discharge enable signal.

13. The internal voltage generator as recited in claim 2, wherein the back bias voltage discharge circuit is provided with an NMOS transistor connected between the back bias voltage and the ground voltage and receiving the discharge enable signal through a gate thereof.

14. The internal voltage generator as recited in claim 1, wherein back bias voltage pumping block includes:

a reference generator for generating the reference voltage, determining a level of the back bias signal in response to the self refresh voltage;

a back bias voltage detector for comparing the reference voltage and the back bias voltage to thereby output the back bias enable signal; and a back bias voltage pump for pumping the back bias voltage in response to the back bias enable signal.

15. A semiconductor memory device for generating a back bias voltage, comprising:

a back bias voltage pumping block for comparing a reference voltage with a feedback back bias voltage to generate a back bias enable signal and the back bias voltage in response to an activated self refresh signal; and a back bias voltage discharge controlling unit for discharging the back bias voltage into a ground voltage in response to the activated self refresh signal and the back bias enable signal.

16. The semiconductor memory device as recited in claim 15, wherein the back bias voltage discharge controlling unit includes:

a pulse generator for generating a sink pulse by delaying the self refresh signal for a predetermined time;

a back bias voltage discharge controller for activating a discharge enable signal discharging the back bias voltage into the ground voltage when the self refresh signal is activated and for inactivating the discharge enable signal when the back bias enable signal is activated; and a back bias voltage discharge circuit for transmitting the ground voltage to the back bias voltage in response to an activation of the discharge enable signal.

17. The semiconductor memory device as recited in claim 15, wherein back bias voltage pumping block includes:

a reference generator for generating the reference voltage, determining a level of the back bias voltage in response to the self refresh signal;

a back bias voltage detector for comparing the reference voltage and the back bias voltage to thereby output the back bias enable signal; and a back bias voltage pump for pumping the back bias voltage in response to the back bias enable signal.

* * * * *

UNITED STATES PATENT AND TRADEMARK OFFICE
CERTIFICATE OF CORRECTION

| | | |
|---|---|---|
| PATENT NO. | : 7,292,483 B2 | Page 1 of 1 |
| APPLICATION NO. | : 11/322947 | |
| DATED | : November 6, 2007 | |
| INVENTOR(S) | : Sohn et al. | |

It is certified that error appears in the above-identified patent and that said Letters Patent is hereby corrected as shown below:

In Claim 14, line 5, please delete "voltage" and insert -- signal --.

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO.       : 7,292,483 B2
APPLICATION NO.  : 11/322947
DATED            : November 6, 2007
INVENTOR(S)      : Sohn et al.

Page 1 of 1

It is certified that error appears in the above-identified patent and that said Letters Patent is hereby corrected as shown below:

Column 7, in Claim 14, line 3, please delete "voltage" and insert -- signal --.

This certificate supersedes the Certificate of Correction issued June 30, 2009.

Signed and Sealed this

Twenty-eighth Day of July, 2009

JOHN DOLL
*Acting Director of the United States Patent and Trademark Office*